(12) United States Patent
Horimizu

(10) Patent No.: US 7,708,834 B2
(45) Date of Patent: May 4, 2010

(54) BOLT AND PLASMA PROCESSING APPARATUS PROVIDED WITH SAME

(75) Inventor: Makoto Horimizu, Hokuto (JP)

(73) Assignee: Tokyo Electron Limited, Tokyo (JP)

( * ) Notice: Subject to any disclaimer, the term of this patent is extended or adjusted under 35 U.S.C. 154(b) by 1098 days.

(21) Appl. No.: 11/263,955

(22) Filed: Nov. 2, 2005

(65) Prior Publication Data

US 2006/0118042 A1     Jun. 8, 2006

Related U.S. Application Data

(60) Provisional application No. 60/635,969, filed on Dec. 15, 2004.

(30) Foreign Application Priority Data

Nov. 2, 2004    (JP)  ............................. 2004-319411

(51) Int. Cl.
*C23C 16/00* (2006.01)
*C23F 1/00* (2006.01)
*H01L 21/306* (2006.01)

(52) U.S. Cl. ............... 118/715; 118/723 E; 156/345.43

(58) Field of Classification Search ................ 118/715, 118/722, 723 R, 723 E; 156/345.43, 345.44, 156/345.45, 345.46, 345.47
See application file for complete search history.

(56) References Cited

U.S. PATENT DOCUMENTS

| | | | | |
|---|---|---|---|---|
| 5,332,443 A | * | 7/1994 | Chew et al. | ................. 118/729 |
| 6,008,130 A | * | 12/1999 | Henderson et al. | ........... 438/710 |
| 2003/0196755 A1 | * | 10/2003 | Antolik | ................... 156/345.1 |

FOREIGN PATENT DOCUMENTS

JP      2579389      6/1998

* cited by examiner

*Primary Examiner*—Parviz Hassanzadeh
*Assistant Examiner*—Maureen Gramaglia
(74) *Attorney, Agent, or Firm*—Oblon, Spivak, McClelland, Maier & Neustadt, L.L.P.

(57) ABSTRACT

A bolt which is driven into a female screw portion disposed in a brittle member in a wear environment includes a head formed of a wear resistant material, a body which is formed of a resin having elasticity or plasticity and has a first male screw portion, and a placed member disposed between the head and the body and formed of a wear resistant resin having elasticity or plasticity. The body further includes a second male screw portion disposed along a central axis of the body and the head includes a female screw portion which the second male screw portion is driven into. The placed member is of a plate shape and has a through hole in its central portion, and a diameter of the through hole is smaller than or equal to a nominal diameter of the first male screw portion and larger than or equal to a nominal diameter of the second male screw portion.

7 Claims, 3 Drawing Sheets

BOLT AND PLASMA PROCESSING APPARATUS PROVIDED WITH SAME

CROSS-REFERENCE TO RELATED APPLICATIONS

This document claims priority to Japanese Patent Application Number 2004-319411, filed Nov. 2, 2004 and U.S. Provisional Application No. 60/635,969, filed Dec. 15, 2004, the entire content of which are hereby incorporated by reference.

FIELD OF THE INVENTION

The present invention relates to a bolt and a plasma processing apparatus; and, more particularly, to a bolt which is driven into a female screw portion disposed in a brittle member and a plasma processing apparatus provided therewith.

BACKGROUND OF THE INVENTION

Conventionally, a parallel plate type plasma processing apparatus is widely employed as a plasma processing apparatus for performing a plasma processing such as an etching or a film forming process on a wafer serving as an object to be processed. The plasma processing apparatus includes a chamber serving as a vacuum processing vessel, and components such as an upper and a lower electrode, a susceptor, a focus ring and a shield ring are disposed in the chamber.

In the plasma processing apparatus, a processing gas is introduced into the chamber and, then, is converted into a plasma to generate radicals in, e.g., an etching process. By those radicals, components in the chamber and an inner wall of the chamber as well as a surface of the wafer are etched to be worn away. Further, the processing gas in the etching process contains a halogen element and, thus, the components in the chamber and the inner wall of the chamber tend to undergo an intensive corrosion. Accordingly, the components in the chamber and the inner wall of the chamber are formed of a wear resistant ceramic material, or a thermally sprayed ceramic coating is used on the surface thereof in order to prevent the wear and corrosion thereof.

Typically, the components in the chamber are attached to the inner wall of the chamber by using bolts for the maintenance and repair. The surface of the inner wall of the chamber is formed of a ceramic material as described above, so that a female screw portion for coupling to the bolt is formed in a ceramic portion. In this case, since the ceramic material is a brittle material, the female screw portion cannot be shaped accurately. Further, when an attachment bolt is made of, e.g., metal, there occurs galling between the bolt (male screw portion) and the female screw portion of the inner wall of the chamber. Thus, in the conventional plasma processing apparatus, the bolt is formed of a resin having elasticity and plasticity to prevent the galling. For example, as such a bolt, there is known a plastic bolt whose head and body made of a plastic material are in combination with each other (see, e.g., Japanese Utility Model No. 2579389)

However, since the plastic material is easily worn away by the radicals, the bolt (male screw portion) is worn away by the radicals that enter into a gap between the bolt (male screw portion) and the female screw portion of the inner wall of the chamber. Consequently, an axial force of the bolt is reduced such that the components in the chamber may fall apart.

A fluorine resin, e.g., PTFE, is known as a resin which is not worn away by the radicals, but the fluorine resin has a low hardness. Accordingly, the bolt made of fluorine resin is broken by a clamping torque, resulting in the degradation of the axial force to make the components fall apart.

SUMMARY OF THE INVENTION

It is, therefore, an object of the present invention to provide a bolt for stably coupling a component with a brittle member in the wear and corrosion environment and a plasma processing apparatus provided therewith.

To achieve the object, there is provided a bolt which is driven into a female screw portion disposed in a brittle member in a wear environment, the bolt including a head formed of a wear resistant material; a body, formed of a resin having elasticity or plasticity, including a first male screw portion; and a placed member disposed between the head and the body and formed of a wear resistant resin having elasticity or plasticity.

In the bolt, the body further includes a second male screw portion disposed along a central axis of the body and the head includes a female screw portion which the second male screw portion is driven into.

In the bolt, the placed member is of a plate shape and has a through hole in its central portion, and a diameter of the through hole is smaller than or equal to a nominal diameter of the first male screw portion and larger than or equal to a nominal diameter of the second male screw portion.

In the bolt, the placed member is formed of a fluorine resin.

In the bolt, the brittle member is formed of the wear resistant material.

To achieve the object, there is provided a plasma processing apparatus having a processing chamber in which a wear environment is formed, the apparatus including a component disposed in the processing chamber; and a bolt for attaching the component to a base portion formed of a brittle member, wherein the bolt includes a head formed of a wear resistant material, a body which is formed of a resin having elasticity or plasticity and has a male screw portion, and a placed member which is disposed between the head and the body and formed of a wear resistant resin having elasticity or plasticity.

In accordance with the present invention, a bolt, which is driven into a female screw portion disposed in a brittle member in a wear environment, includes a head formed of a wear resistant material; a body, formed of a resin having elasticity or plasticity, including a first male screw portion; and a placed member disposed between the head and the body and formed of a wear resistant resin having elasticity or plasticity. Accordingly, the galling between the male screw portion and the female screw portion provided in the brittle member does not occur. Further, the radicals do not enter into a gap between the male screw portion and the female screw portion, whereby the male screw portion is not worn away. Therefore, the component can be stably attached to the brittle member in the wear environment by using the bolt.

In accordance with the present invention, the body further includes a second male screw portion disposed along a central axis of the body and the head includes a female screw portion which the second male screw portion is driven into. Accordingly, although the head and the body are formed of different materials, the head and the body can be stably combined, thereby being handled as a single unit. Therefore, the component can be easily attached to the brittle member.

In accordance with the present invention, the placed member is of a plate shape and has a through hole in its central portion, and a diameter of the through hole is smaller than or equal to a nominal diameter of the first male screw portion and larger than or equal to a nominal diameter of the second male screw portion. Accordingly, the head and the body can be combined with the placed member interposed therebetween. Thus, the head, the body and the placed member can be handled as a single unit. Therefore, the component can be more easily attached to the brittle member.

In accordance with the present invention, since the placed member is formed of a fluorine resin, the placed member is not worn away by the radicals and, further, it is possible to definitely prevent the radicals from entering into the gap between the male screw portion and the female screw portion. Therefore, the component can be stably attached to the brittle member in the wear environment by using the bolt.

In accordance with the present invention, since the brittle member is formed of the wear resistant material, anti-wear measures can be easily executed.

In accordance with the present invention, a plasma processing apparatus having a processing chamber in which a wear environment is formed includes a component disposed in the processing chamber; and a bolt for attaching the component to a base portion formed of a brittle member, wherein the bolt includes a head formed of a wear resistant material, a body which is formed of a resin having elasticity or plasticity and has a male screw portion, and a placed member which is disposed between the head and the body and formed of a wear resistant resin having elasticity or plasticity. Accordingly, the galling between the male screw portion and the female screw portion provided in the brittle member does not occur. Further, the radicals do not enter into a gap between the male screw portion and the female screw portion, whereby the male screw portion is not worn away. Therefore, the component can be stably attached to the brittle member in the wear environment by using the bolt.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

A preferred embodiment of the present invention will now be described with reference to the accompanying drawings.

Hereinafter, there will be described a plasma processing apparatus in accordance with the preferred embodiment of the present invention.

Figure 1:
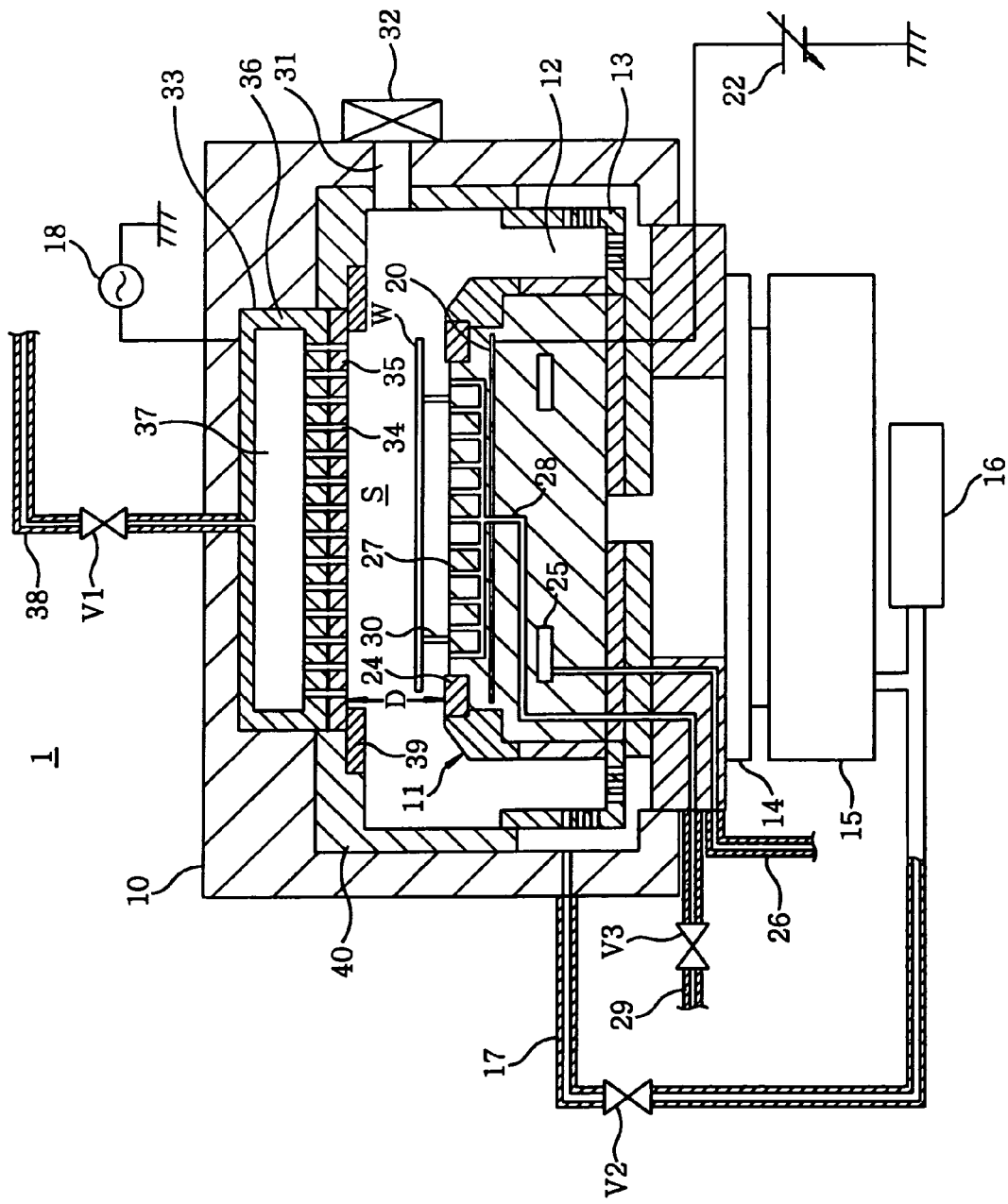
FIG. 1 is a longitudinal cross sectional view showing a schematic configuration of the plasma processing apparatus in accordance with a preferred embodiment of the present invention.

FIG. 1 is a longitudinal cross sectional view showing a schematic configuration of the plasma processing apparatus in accordance with the preferred embodiment of the present invention.

A plasma processing apparatus 1 shown in FIG. 1, which is used as an etching processing apparatus for performing an etching process on a wafer W, includes a cylindrical chamber (accommodation chamber) 10 made of metal such as aluminum or stainless steel. A cylindrical susceptor 11 serving as a stage for mounting thereon the wafer W having a diameter of, e.g., 300 mm is disposed in a lower portion of the chamber 10.

An annular focus ring 24 is disposed on the susceptor 11 to surround an outer peripheral portion of the susceptor 11. The focus ring 24 is formed of silicon (Si) and the like and converges a plasma generated above the susceptor 11 toward the wafer W.

A circular electrode plate 20, formed of a conductive film, for electrostatically attracting and holding the wafer W is disposed inside an upper portion of the susceptor 11. A DC power supply 22 is electrically connected to the electrode plate 20. The wafer W is adsorbed to be held on the top surface of the susceptor 11 by Coulomb force or Johnsen-Rahbek force produced by a DC voltage applied to the electrode plate 20 from the DC power supply 22. When the wafer W need not be adsorbed on the top surface, the electrode plate 20 is cut off from the DC power supply 22 to be in a floating state.

A coolant chamber 25 of, e.g., a ring shape is provided inside the susceptor 11. A coolant, e.g., cooling water, kept at a predetermined temperature is supplied to the coolant chamber 25 from a chiller unit (not shown) via a pipe 26 to be circulated therein, whereby the wafer W on the susceptor 11 is controlled to be maintained at a predetermined process temperature by the coolant.

In the top surface of the susceptor 11, thermally conductive gas supply holes 27 and a thermally conductive gas supply groove (not shown) are disposed in a portion to which the wafer is adsorbed (hereinafter, referred to as an "adsorbing surface"). Those thermally conductive gas supply holes 27 and the like are connected to a thermally conductive gas feeding pipe 29 equipped with a valve V3 via a thermally conductive gas supply line 28 disposed in the susceptor 11. A thermally conductive gas, e.g., He gas, from a thermally conductive gas supply unit (not shown) coupled to the thermally conductive gas feeding pipe 29 is supplied into a gap between the adsorbing surface and the bottom surface of the wafer W through the thermally conductive gas supply holes 27 and the like. Accordingly, heat transfer is improved between the wafer W and the susceptor 11. Further, the valve V3 can isolate the thermally conductive gas supply holes 27 and the like from the thermally conductive gas supply unit.

Further, disposed on the adsorbing surface is a plurality of pusher pins 30, i.e., lift pins, which can be freely moved up and down from the top surface of the susceptor 11. A rotational movement of a motor (not shown) is converted into a linear movement by ball screws and the like, whereby the pusher pins 30 can be moved vertically. When the wafer W is adsorbed to be held on the adsorbing surface, the pusher pins 30 are accommodated in the susceptor 11, whereas when the wafer W is unloaded from the chamber 10 after the plasma processing such as an etching process is finished, the pusher pins 30 are protruded from the top surface of the susceptor 11 such that the wafer W is separated to be lifted from the susceptor 11.

A shower head 33 is disposed in an inner upper portion of the chamber 10. The shower head 33 is connected to a high frequency power supply 18, which applies a predetermined high frequency power to the shower head 33. Accordingly, the shower head 33 functions as an upper electrode.

The shower head 33 includes a circular electrode plate 35 having a plurality of gas ventholes 34 and an electrode supporting member 36 for supporting the electrode plate 35 which can be attached thereto or detached therefrom. Further, a buffer chamber 37 is provided in the electrode supporting member 36 and connected to a processing gas supply unit (not shown) via a processing gas inlet pipe 38. A valve V1 is installed in the middle of the processing gas inlet pipe 38. The valve V1 can isolate the buffer chamber 37 from the processing gas supply unit. Here, a distance D between electrodes, i.e., the susceptor 11 and the shower head 33, is set to be equal to or larger than, e.g., 35±1 mm.

Further, an annular quartz guide (shield ring) 39 facing the focus ring 24 is disposed below the electrode plate 35 to cover an outer peripheral portion of the electrode plate 35. The quartz guide 39 is formed of, e.g., $SiO_2$ and protects the outer peripheral portion of the electrode plate 35 and an inner peripheral portion of an inner wall 40 of the chamber 10 formed of an insulator from the plasma generated between the susceptor 11 and the shower head 33.

Formed between the sidewall of the chamber 10 and the susceptor 11 is a gas exhaust path 12 that functions as a channel for discharging a gas existing above the susceptor 11 to the outside of the chamber 10. An annular baffle plate 13 is disposed in the middle of the gas exhaust path 12, and a lower portion of the gas exhaust path 12, which is under the baffle plate 13, is coupled to an automatic pressure control valve 14 (hereinafter, referred to as an "APC") that is a variable butterfly valve. The APC 14 is connected to a turbo molecular pump 15 (hereinafter, referred to as a "TMP"), which is a gas exhaust pump for vacuum exhaust. Further, the APC 14 is connected to a dry pump 16 (hereinafter, referred to as a "DP") serving as a gas exhaust pump via the TMP 15. A gas exhaust channel including the APC 14, TMP 15, and DP 16 is hereinafter referred to as a "main pumping line", wherein the APC 14 controls pressure in the chamber 10 and, additionally, the TMP 15 and DP 16 depressurize the chamber 10 almost to vacuum.

Further, the lower portion of the gas exhaust path 12, which is under the baffle plate 13, is coupled to another gas exhaust channel (hereinafter, referred to as a "rough pumping line"), which is separate from the main pumping line. The rough pumping line includes a gas exhaust pipe 17, having a diameter of, e.g., 25 mm, for connecting the lower portion to the DP 16; and a valve V2 installed in the middle of the gas exhaust pipe 17. The valve V2 can isolate the lower portion of the gas exhaust path 12 from the DP 16. A gas in the chamber 10 is discharged to the outside by the DP 16 in the rough pumping line.

A gate valve 32 for opening or closing a loading/unloading port 31 for the wafer W is installed on the sidewall of the chamber 10. In the chamber 10 of the plasma processing apparatus 1, as describe above, a high frequency power is applied to the shower head 33, whereby an $O_2$ single gas serving as a processing gas is converted into a plasma in a space S to produce radicals.

When an etching process is performed in the plasma processing apparatus 1, first, after the gate valve 32 is opened, the wafer W serving as an object to be processed is loaded into the chamber 10 and mounted on the susceptor 11. Then, a processing gas such as $O_2$ single gas or gaseous mixture containing $O_2$ gas (e.g., gaseous mixture containing $CF_4$ gas and $O_2$ gas) through the shower head 33 is introduced into the chamber 10 at a predetermined flow rate, and a specified pressure level is maintained in the chamber 10 by the APC 14 and the like. Further, a high frequency power is applied to the shower head 33 from the high frequency power supply 18 and a DC voltage is applied to the electrode plate 20 from the DC power supply 22, whereby the wafer W is attracted and held on the susceptor 11. Then, the $O_2$ single gas introduced through the shower head 33 is converted into a plasma as described above, thereby producing radicals. The radicals are converged on the wafer W by the focus ring 24, thereby chemically etching the surface of the wafer W.

Besides the surface of the wafer W, the components in the chamber, for example, focus ring 24, the susceptor 11, the baffle plate 13 and the electrode plate 35, and the inner wall 40 of the chamber, which are exposed to the atmosphere in the chamber 10, are etched by the radicals and, thus, they become worn away by repeated etching. Further, a gas containing a halogen element such as fluoride, chloride and bromide in addition to the $O_2$ single gas may be employed as a processing gas for etching, thereby forming an intensive corrosion environment in the chamber. Then, the components in the chamber and the inner wall 40 of the chamber are getting corroded by repeated etching. Accordingly, the components in the chamber and the inner wall 40 of the chamber are formed of a wear resistant ceramic material or a thermally sprayed ceramic coating is used on the surface thereof in order to prevent the wear and corrosion thereof. At this time, for example, yttrium oxide ($Y_2O_3$) or aluminum oxide ($Al_2O_3$) is preferably used as a ceramic material (brittle material). In the plasma processing apparatus 1, the inner wall 40 of the chamber is formed of aluminum oxide, so that the inner wall 40 is a brittle member.

Further, the quartz guide (component) 39 is attached to the inner wall 40 of the chamber by using a bolt 41 to be described later for the maintenance and repair.

Figure 2:
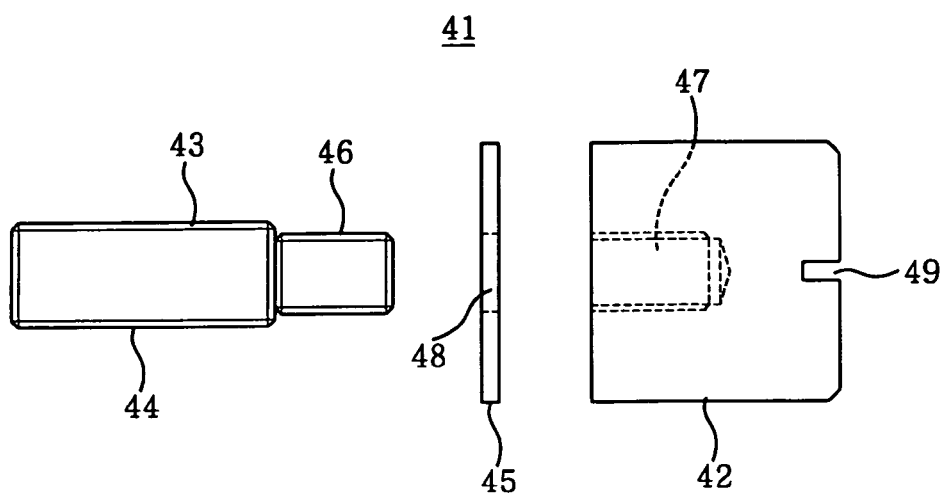
FIG. 2 is an exploded side view showing a schematic configuration of a bolt in accordance with the preferred embodiment of the present invention.

FIG. 2 is an exploded side view showing a schematic configuration of a bolt in accordance with the preferred embodiment of the present invention.

Referring to FIG. 2, the bolt 41 includes a cylindrical head 42 having a diameter of, e.g., 5 mm; a body 44 in which a male screw portion 43 having a screw size of, e.g., M4 is formed; and a washer (placed member) 45 shaped like a circular plate having an outer diameter of, e.g., 5 mm. The head 42 is made of, e.g., aluminum oxide having a wear resistance against the radicals and the body 44 is made of a resin having plasticity and heat resistance, for instance, a wholly aromatic polyimide resin. Further, the washer 45 is made of a resin having a wear resistance against the radicals, plasticity and heat resistance, for example, a tetrafluoroethylene resin (PTFE).

The body 44 has a male screw portion 46 having a screw size of, e.g., M3, which is disposed along a central axis of the body 44. The head 42 has a female screw portion 47 having a screw size of, e.g., M3, which is bored along a central axis of the body 44. In the bolt 41, the head 42 and the body 44 is coupled mechanically by driving the male screw portion 46 into the female screw portion 47.

In a central portion of the washer 45, there is a through hole 48 having a diameter of, e.g., 3.5 mm. The diameter of the through hole 48 is larger than or equal to a nominal diameter of the male screw portion 46, whereby the male screw portion 46 can be inserted into the through hole 48 of the washer 45 when coupling the head 42 with the body 44. Further, by driving the male screw portion 46 protruded from the through hole 48 into the female screw portion 47, the male screw portion 46, the washer 45 and the head 42 are coupled together as a single body. At this time, the washer 45 is interposed between the male screw portion 43 and the head 42, but the diameter of the through hole 48 is smaller than or equal to a nominal diameter of the male screw portion 43. Consequently, the washer 45 can be interposed between the male screw portion 43 and the head 42 without being separated therefrom.

The head 42 has a groove portion 49 which is engraved in a diametric direction on a surface opposite to the surface on which an opening of the female screw portion 47 is positioned. When the groove portion 49 is engaged with a minus driver (not shown), a clamping torque is transferred to the head by the minus driver to thereby tighten the bolt 41.

Figure 3:
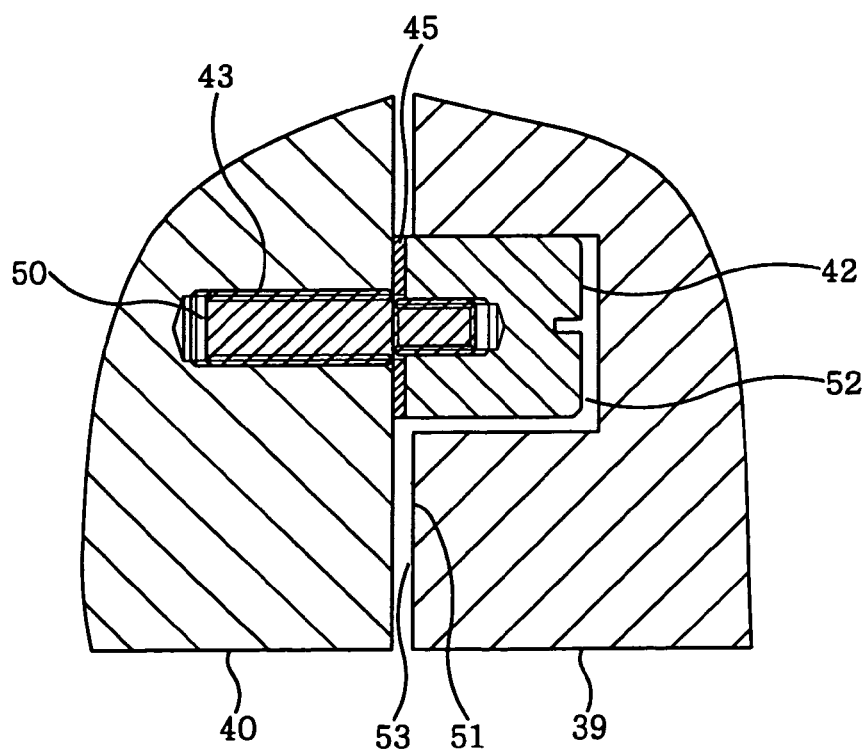
FIG. 3 depicts how the bolt shown in FIG. 2 is used.

FIG. 3 depicts how the bolt shown in FIG. 2 is used.

Referring to FIG. 3, the bolt 41 is tightened to the inner wall 40 of the chamber by driving the male screw portion 43 of the body 44 into a female screw portion 50 bored in the inner wall 40 of the chamber. Thus, the head 42 is protruded from the inner wall 40 of the chamber. Further, the protruded head 42 is engaged with a hook groove 52 bored in a side surface 51 of the quartz guide 39. Accordingly, the quartz guide 39 is supported by the bolt 41 and, then, attached to the inner wall 40 of the chamber.

The shape of the female screw portion 50 bored in the inner wall 40 of the chamber is not formed accurately since the inner wall 40 is formed of aluminum oxide that is a brittle material. However, the male screw portion 43 which is driven into the female screw portion 50 is formed of a tetrafluoroethylene resin having plasticity, whereby the male screw portion 43 can accommodate the shape discrepancy of the female screw portion 50.

Further, since the quartz guide 39 is supported by only the head 42, a gap 53 may be formed between the inner wall 40 of the chamber and the quartz guide 39 and the radicals may enter into the gap 53. However, when the bolt is tightened to the inner wall 40 of the chamber, the washer 45 interposed between the inner wall 40 of the chamber and the head 42 fills a gap therebetween, whereby the radicals that have entered into the gap 53 cannot enter into a gap between the male screw portion 43 of the body 44 and the female screw portion 50 of the inner wall 40 of the chamber.

The bolt in accordance with the preferred embodiment includes the head 42 made of aluminum oxide; the body 44, formed of a wholly aromatic polyimide resin, having the male screw portion 43; and the washer 45 disposed between the heat 42 and the body 44 and formed of a tetrafluoroethylene resin. Since the male screw portion 43 is formed of a tetrafluoroethylene resin having plasticity, the male screw portion 43 can accommodate the shape discrepancy of the female screw portion 50 bored in the inner wall 40 of the chamber that is a brittle member. Accordingly, the galling between the male screw portion 43 and the female screw portion 50 does not occur. Further, since the washer 45 fills a gap between the inner wall 40 of the chamber and the head 42, the radicals do not enter into a gap between the male screw portion 43 and the female screw portion 50, whereby the male screw portion is not worn away. Therefore, the quartz guide 39 can be stably attached to the inner wall 40 of the chamber in an environment containing radicals by using the bolt 41.

Further, since the body 44 has the male screw portion 46 disposed along its central axis and the head 42 has the female screw portion 47 into which the male screw portion is driven, although the head 42 and the body 44 are formed of different materials, the head 42 and the body 44 can be stably combined. Accordingly, the head 42 and the body 44 can be handled as a single unit. Further, since the washer 45 has the through hole 48 in its central portion and the diameter of the through hole 48 is smaller than or equal to the nominal diameter of the male screw portion 43 and larger than or equal to the nominal diameter of the male screw portion 46, the head 42 and the body 44 can be combined with the washer 45 interposed therebetween. Thus, the head 42, the body 44 and the washer 45 can be handled as a single unit. Therefore, the quartz guide 39 can be easily attached to the inner wall 40 of the chamber.

Since the washer 45 is made of a tetrafluoroethylene resin, the washer 45 is not worn away by the radicals and, further, it is possible to definitely prevent the radicals from entering into the gap between the male screw portion 43 and the female screw portion 50. Additionally, because the tetrafluoroethylene resin has plasticity, the washer 45 can absorb the collapse of the inner wall 40 serving as a washer-placed surface toward the female screw portion 50, thereby more stably attaching the quartz guide 39 to the inner wall 40 of the chamber.

Further, since the inner wall 40 of the chamber is made of aluminum oxide, which is same as the material of the head 42, anti-wear measures can be investigated by considering only a wear resistance of aluminum oxide and therefore can be carried out easily.

Figure 4:
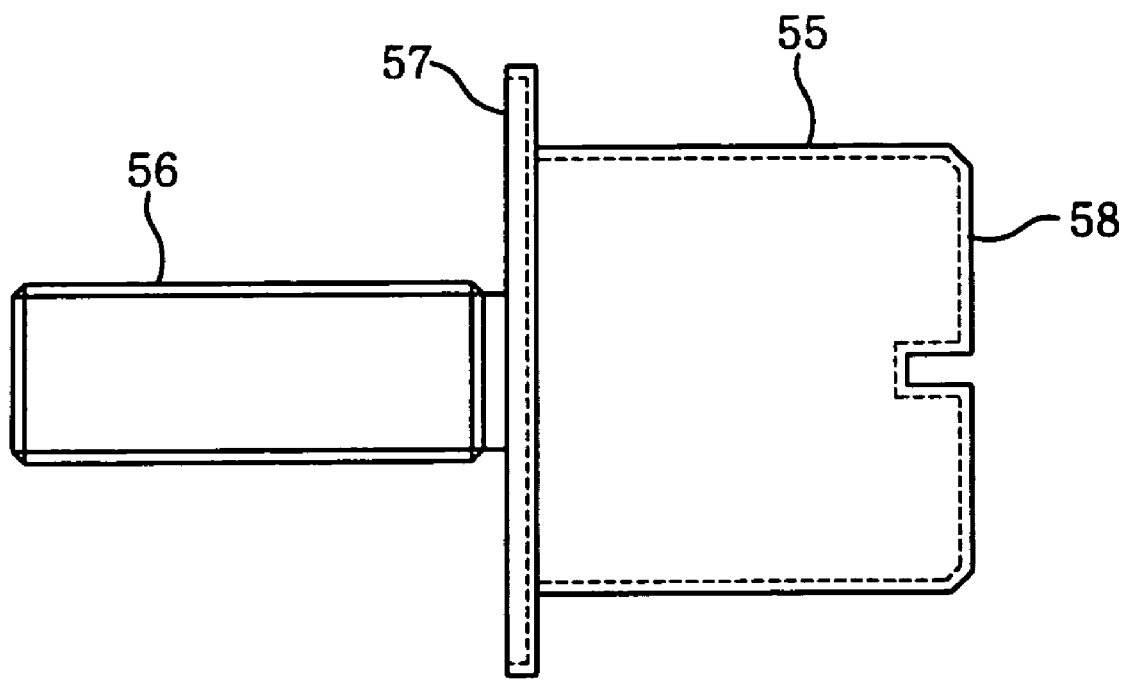
FIG. 4 schematically illustrates a modified example of the bolt in the preferred embodiment of the present invention.

Although the bolt is configured by a plurality of members as described above in the preferred embodiment, the bolt can be made as a single unit. For example, as shown in FIG. 4, the bolt 54 is formed by combining a head 55, a body 56 and a flange 57 provided in a peripheral end portion of the head 55 close to the body 56 to be a single unit by a resin having plasticity and heat resistance, e.g., a wholly aromatic polyimide resin. Further, the surfaces of the head 55 and the flange 57 are preferably coated with a radical resistant material, e.g., an aluminum oxide film 58.

The bolt 54 is closely attached to the inner wall 40 of the chamber by a clamping force. Accordingly, the radicals do not enter into a gap between the male screw portion 43 and the female screw portion 50, whereby the quartz guide 39 can be stably attached to the inner wall 40 of the chamber in an environment containing radicals by using the bolt 54. Further, since the surfaces of the head 55 and the flange 57 are coated with the aluminum oxide film 58 in an environment containing radicals, the flange 57 and the film 58 are not worn away. Furthermore, since the head 55, the body 56 and the flange 57 are formed as a single unit, the quartz guide 39 can be easily attached to the inner wall 40 of the chamber.

Since the bolt 41 mentioned above is employed in an environment containing radicals (chemical etching), the head 42 is made of aluminum oxide and the washer 45 is made of a tetrafluoroethylene resin. But, materials of the head 42 and the washer 45 are not limited thereto and may be radical resistant materials in an environment containing radicals or ion resistant materials in an environment containing ions (physical etching).

Further, although the body 44 is formed of a wholly aromatic polyimide resin having plasticity and heat resistance, the material of the body 44 may be another resin having plasticity and heat resistance or a resin having elasticity and heat resistance without being limited thereto.

Moreover, although the washer 45 is formed of a resin having plasticity, the material of the washer 45 is not limited thereto and may be a resin having elasticity.

In the embodiment described above, the bolt 41 is used in the etching processing apparatus, but the usage thereof is not limited thereto and it can be applied to another plasma processing apparatus, for example, CVD processing apparatus or a processing apparatus having therein another wear environment.

Further, in the above embodiment, when the quartz guide 39 is attached to the inner wall 40 of the chamber, the bolt 41 is used to couple them. However, the bolt 41 can be employed for any component in the chamber which is attached to a brittle member without being limited to the quartz guide 39.

Hereinafter, there will be described an example of the present invention in detail.

Example

First, in the plasma processing apparatus 1 shown in FIG. 1, the quartz guide 39 was attached to the inner wall 40 of the chamber by using four bolts 41 shown in FIG. 2.

Then, an etching process was performed on 2000 sheets of wafers W. After that, the four bolts 41 were loosened and a wear amount and a wear rate thereof were measured. Additionally, a loosening torque of each bolt 41 was also measured. The following Table 1 shows the wear amount, the wear rate and the loosening torque measured in Examples 1, 2, 3 and 4.

Comparison Example

First, in the plasma processing apparatus 1 shown in FIG. 1, the quartz guide 39 was attached to the inner wall 40 of the chamber by using wholly resin bolts, each having a body and a head formed of a wholly aromatic polyimide resin as a single unit.

Then, an etching process was performed on 750 sheets of wafers W. After that, the wholly resin bolts were loosened and a wear amount and a wear rate thereof were measured. The following Table 1 shows the wear amount and the wear rate measured in Comparison example 1.

TABLE 1

|  | wear amount (g) | wear rate (%) | reduced loosening torque (kgf·cm) |
| --- | --- | --- | --- |
| Example 1 | 0.0005 | 0.54 | 0.10 |
| Example 2 | 0.0000 | 0.00 | 0.20 |
| Example 3 | 0.0004 | 0.42 | 0.20 |
| Example 4 | 0.0005 | 0.54 | 0.20 |
| Comparison example 1 | 0.0010 | 1.10 | — |

As shown in Table 1, the wear amount ranges from 0 to 0.0005 g in Examples 1 to 4. Typically, when a male screw portion of a wholly aromatic polyimide resin is driven into a female screw portion of aluminum oxide, the bolt has the wear amount ranging from about 0.0004 g to 0.0008 g. Accordingly, the wear amount is practically zero and the male bolt 43 is not worn away in Examples 1 to 4. Further, since the reduced loosening torque is smaller than or equal to 0.20 kgf·cm, it is found that the axial force of the bolt 41 is not reduced.

On the other hand, in Comparison example 1, the wear amount is 0.0010 g. Even considering the wear amount of the male screw portion of a wholly aromatic polyimide resin caused by driving it into the female screw portion, it is found that the male screw portion of the body is worn away.

From the results, it is concluded that the quartz guide 39 can be stably attached to the inner wall 40 of the chamber in an environment containing radicals by using the bolt 41 shown in FIG. 2.

While the invention has been shown and described with respect to the preferred embodiments, it will be understood by those skilled in the art that various changes and modifications may be without departing from the spirit and scope of the invention as defined in the following claims.

What is claimed is:

1. A plasma processing apparatus including a processing chamber in which a wear environment is formed, the apparatus comprising:
   a component disposed in the processing chamber; and
   a bolt that attaches the component to a base portion formed of a brittle member,
   wherein the bolt includes a head including a wear resistant material, a body which includes a resin having elasticity or plasticity and has a first male screw portion, and a placed member which is disposed between the head and the body and including a wear resistant resin having elasticity or plasticity;
   wherein the body further includes a second male screw portion disposed along a central axis of the body and the head includes a female threaded screw portion which the second male screw portion is driven into, a diameter of the second male screw portion being smaller than that of the first male screw portion;
   wherein the female threaded screw portion is disposed inside a blind hole in the head;
   wherein the bolt attaches the component to the base portion via a threaded female blind hole disposed in the base portion;
   wherein the head is disposed in a female blind hole in the component.

2. The plasma processing apparatus of claim 1, wherein the component is a quartz guide.

3. The plasma processing apparatus of claim 2, wherein the quartz guide overlaps a boundary between the base portion and an electrode plate disposed in the processing chamber.

4. The plasma processing apparatus of claim 3, wherein the first male screw portion is disposed at least partially in a hole in a vertical wall of the base portion.

5. The plasma processing apparatus of claim 1, wherein the head comprises ceramic.

6. The plasma processing apparatus of claim 1, wherein the head comprises aluminum oxide.

7. The plasma processing apparatus of claim 1, wherein the head, body, and placed member comprise first, second, and third materials, respectively, the first material is different from the second and third materials, and the second material is different from the third material.

* * * * *